(12) United States Patent
Breitwisch et al.

(10) Patent No.: US 8,589,320 B2
(45) Date of Patent: Nov. 19, 2013

(54) AREA EFFICIENT NEUROMORPHIC SYSTEM THAT CONNECTS A FET IN A DIODE CONFIGURATION, AND A VARIABLE RESISTANCE MATERIAL TO JUNCTIONS OF NEURON CIRCUIT BLOCKS

(75) Inventors: Matthew J. Breitwisch, Yorktown Heights, NY (US); Chung Hon Lam, Peekskill, NY (US); Dharmendra S. Modha, San Jose, CA (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/548,532

(22) Filed: Jul. 13, 2012

(65) Prior Publication Data

US 2012/0284217 A1 Nov. 8, 2012

Related U.S. Application Data

(62) Division of application No. 12/620,624, filed on Nov. 18, 2009, now Pat. No. 8,311,965.

(51) Int. Cl.
  *G06E 1/00* (2006.01)
(52) U.S. Cl.
  USPC .......................................... 706/15
(58) Field of Classification Search
  USPC ........................ 706/12, 15, 45, 62
  See application file for complete search history.

(56) References Cited

U.S. PATENT DOCUMENTS

| | | |
|---|---|---|
| 5,083,285 A | 1/1992 | Shima et al. |
| 5,220,641 A | 6/1993 | Shima et al. |
| 5,422,982 A | 6/1995 | Pernisz |
| 5,479,579 A | 12/1995 | Duong et al. |
| 5,781,702 A | 7/1998 | Alhalabi |
| 5,806,054 A | 9/1998 | Bergemont et al. |
| 6,829,598 B2 | 12/2004 | Milev |
| 7,092,923 B2 | 8/2006 | Arima |

(Continued)

FOREIGN PATENT DOCUMENTS

| | | |
|---|---|---|
| EP | 1843395 A2 | 10/2007 |
| EP | 2117058 A1 | 11/2009 |

(Continued)

OTHER PUBLICATIONS

Türel, Özgür, and Konstantin Likharev. "CrossNets: Possible neuromorphic networks based on nanoscale components.", 2003, International journal of circuit theory and applications 31.1:37-53.*

(Continued)

*Primary Examiner* — David Vincent
(74) *Attorney, Agent, or Firm* — Cantor Colburn LLP; Vazken Alexanian

(57) ABSTRACT

A neuromorphic system includes a plurality of synapse blocks electrically connected to a plurality of neuron circuit blocks. The plurality of synapse blocks includes a plurality of neuromorphic circuits. Each neuromorphic circuit includes a field effect transistor in a diode configuration electrically connected to variable resistance material, where the variable resistance material provides a programmable resistance value. Each neuromorphic circuit also includes a first junction electrically connected to the variable resistance material and an output of one or more of the neuron circuit blocks, and a second junction electrically connected to the field effect transistor and an input of one or more of the neuron circuit blocks.

13 Claims, 12 Drawing Sheets

(56) References Cited

U.S. PATENT DOCUMENTS

| | | | |
|---|---|---|---|
| 7,426,501 B2* | 9/2008 | Nugent | 706/26 |
| 2011/0106742 A1 | 5/2011 | Pino | |
| 2012/0040370 A1 | 2/2012 | Orwar et al. | |
| 2012/0084241 A1 | 4/2012 | Friedman et al. | |

FOREIGN PATENT DOCUMENTS

| | | |
|---|---|---|
| JP | 02133888 | 5/1990 |
| JP | 02178960 | 7/1990 |
| JP | 03008354 | 1/1991 |
| WO | WO2009075694 A1 | 6/2009 |

OTHER PUBLICATIONS

Friesz, et al., A Biomimetic Carbon Nanotube Synapse Circuit, 2007, Viterbi School of Engineering UoSC, 4 pages.

Joshi, et al., A Carbon Nanotube Cortical Neuron with Excitatory and Inhibitory Dendritic Computations, Apr. 2009, IEEE, pp. 133-136.

Y Wang, A Modular Analog CMOS LSI for Feedforward Neural Networks with On-Chip BEP Learning, Circuits and Systems, 1993, ISCAS '93 IEEE International Symposium on May 3-6, 1993 pp. 2744-2747 vol. 4, 4 pages.

J.A. Lansner, et al., An Analog CMOS Chip Set for Neural Networks with Arbitrary Topologies, Neural Networks, IEEE Transactions on vol. 4, Issue 3, May 1993 pp. 441-444.

Andre Dehon, Array-Based Architecture for FET-Based, Nanoscale Electronics, IEEE Transactions on Nanotechnology, vol. 2, No. 1, 2003, 10 pages.

Bernabe Linares-Barranco and Teresa Serrano-Gotarredona, "Memristance Can Explain Spike-Time-Dependent-Plasticity in Neural Synapses," Nature Preceedings, 2009, 4 pages.

International Search Report; International Application No. PCT/EP2010/062368; International Filing Date: Aug. 25, 2011; Date of Mailing: Dec. 13, 2010, 5 pages.

International Search Report—Written Opinion; International Application No. PCT/EP2010/062368; International Filing Date: Aug. 25, 2011; Date of Mailing: Dec. 13, 2010, 8 pages.

Y. Sasago et al., "Cross-Point Phase Change Memory with 4F2 Cell Size Driven by Low-Contact-Resistivity Poly-Si Diode," Symposium on VLSI Technology Digest of Technical Papers, IEEE, 2009, 2 pages.

H Ishiwara, Proposal of Adaptive-Learning Neuron Circuits with Ferroelectric Analog-Memory Weights, Jpn. J. Appl. Phys. 32 (1993) pp. 442-446, 5 pages.

* cited by examiner

AREA EFFICIENT NEUROMORPHIC SYSTEM THAT CONNECTS A FET IN A DIODE CONFIGURATION, AND A VARIABLE RESISTANCE MATERIAL TO JUNCTIONS OF NEURON CIRCUIT BLOCKS

CROSS REFERENCE TO RELATED APPLICATIONS

This application is a divisional application of U.S. Ser. No. 12/620,624, filed Nov. 18, 2009, the contents of which are incorporated by reference herein in their entirety.

GOVERNMENT RIGHTS

This invention was made with Government support under 08-28-SyNAPSE-FP-010 awarded by DARPA. The Government has certain rights in the invention.

BACKGROUND

This invention relates generally to neuromorphic circuits, and more particularly to area efficient implementations of neuromorphic circuits using variable resistors.

Neuromorphic systems, also referred to as artificial neural networks, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems may include various electronic circuits that model biological neurons.

In biological systems, the point of contact between an axon of a neuron and a dendrite on another neuron is called a synapse, and with respect to the synapse, the two neurons are respectively called pre-synaptic and post-synaptic. The essence of individual human experiences is stored in conductance of the synapses. The synaptic conductance changes with time as a function of the relative spike times of pre-synaptic and post-synaptic neurons, as per spike-timing dependent plasticity (STDP). STDP increases the conductance of a synapse if its post-synaptic neuron fires after its pre-synaptic neuron fires, and decreases the conductance of a synapse if the order of the two firings is reversed. Furthermore, the change depends on the precise delay between the two events, such that the more the delay, the less the magnitude of change.

SUMMARY

An exemplary embodiment is a neuromorphic system that includes a plurality of synapse blocks electrically connected to a plurality of neuron circuit blocks. The plurality of synapse blocks includes a plurality of neuromorphic circuits. Each neuromorphic circuit includes a field effect transistor in a diode configuration electrically connected to variable resistance material, where the variable resistance material provides a programmable resistance value. Each neuromorphic circuit also includes a first junction electrically connected to the variable resistance material and an output of one or more of the neuron circuit blocks, and a second junction electrically connected to the field effect transistor and an input of one or more of the neuron circuit blocks.

An additional exemplary embodiment is a method for implementing an area efficient neuromorphic system. The method includes electrically connecting a plurality of synapse blocks to a plurality of neuron circuit blocks, the plurality of synapse blocks including a plurality of neuromorphic circuits. Each neuromorphic circuit is implemented by electrically connecting a field effect transistor in a diode configuration to variable resistance material, the variable resistance material providing a programmable resistance value. A first junction is electrically connected to the variable resistance material and an output of one or more of the neuron circuit blocks. A second junction is electrically connected to the field effect transistor and an input of one or more of the neuron circuit blocks.

Other systems, methods, apparatuses, and/or design structures according to embodiments will be or become apparent to one with skill in the art upon review of the following drawings and detailed description. It is intended that all such additional systems, methods, apparatuses, and/or design structures be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES.

DETAILED DESCRIPTION

The invention as described herein provides for area efficient implementations of neuromorphic circuits. Exemplary embodiments provide neuromorphic systems that implement spiking computations based on spike-timing dependent plasticity (STDP) in a crossbar array with junctions of the array formed of programmable resistors. The programmable resistors can be implemented using phase change material (PCM), metal-oxide, magnetic tunnel junctions, organic thin film, or other materials configurable to provide unipolar variable resistors. For example, in the case of PCM, electrical resistance changes as a function of crystalline and amorphous states, where controlled heating and cooling of PCM can be used to program resistance values. Integrating complementary metal-oxide-semiconductor (CMOS) neuron circuit blocks with nano-scale synaptic devices can produce highly dense and fully connected artificial neural networks, for instance, realizing a synapse density of more than $10^{10}$ synapses/cm$^2$.

Figure 1:
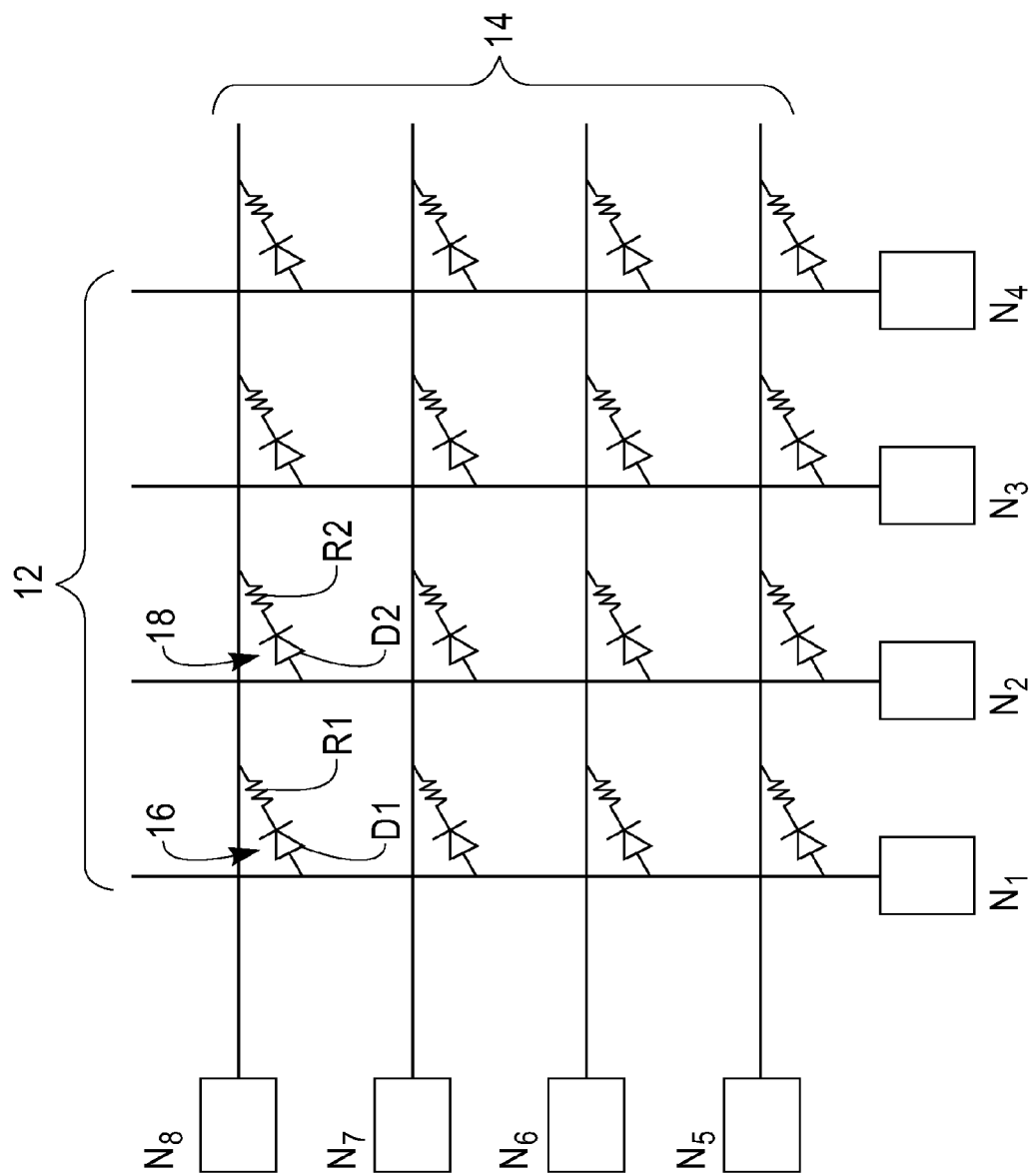
FIG. 1 depicts an example of neuromorphic circuits in a crossbar configuration that may be implemented in exemplary embodiments.

FIG. 1 depicts an example of a system 10 with diode and resistor based neuromorphic circuits in a crossbar configuration that may be implemented in exemplary embodiments. In this example, neuron circuit blocks N1, N2, N3, and N4 are arranged in columns 12, and neuron circuit blocks N5, N6, N7, and N8 are arranged in rows 14. Synaptic devices formed of equivalent diode and resistor circuits make crossbar connections between the columns 12 and rows 14. For example, synaptic device 16 includes equivalent diode D1 and resistor R1 in series between neuron circuit blocks N1 and N8. Similarly, synaptic device 18 includes equivalent diode D2 and resistor R2 in series between neuron circuit blocks N2 and N8. Resistors R1 and R2 are variable/programmable resistors to support STDP. Exemplary embodiments include area efficient implementations of system 10 using diode-configured field effect transistors (FETs) in combination with shared islands of variable resistance material to achieve a high-density solution.

Figure 2:
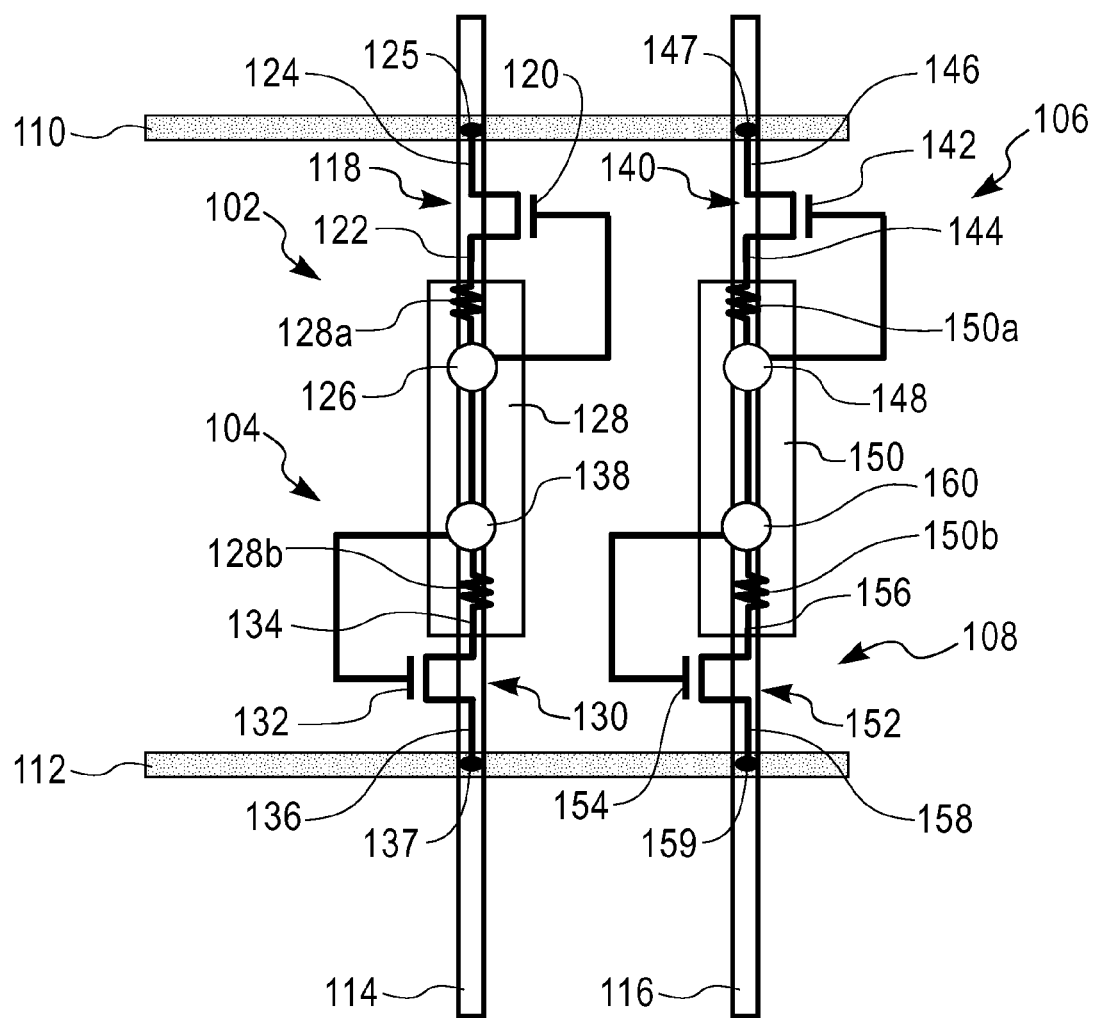
FIG. 2 depicts an example of neuromorphic circuits that may be implemented in exemplary embodiments.

In order to implement a highly dense artificial neural network, area efficient implementations of neuromorphic circuits with variable resistance material are used. FIG. 2 depicts an example of neuromorphic circuits using variable resistance material that may be implemented in exemplary embodiments. FIG. 2 depicts four synaptic devices as neuromorphic circuits 102, 104, 106, and 108 in a crossbar configuration. Lines 110 and 112 represent dendrite connections, and lines 114 and 116 represent axon connections, where signals flow from axons outputs to dendrite inputs between neurons in an artificial neural network. Each of the neuromorphic circuits 102-108 includes a field effect transistor (FET) in a diode-configuration. For example, neuromorphic circuit 102 includes FET 118, where source 124 of FET 118 is electrically connected to line 110 at junction 125. At junction 126, gate 120 of FET 118 is electrically connected to variable resistance material 128 and to line 114. The variable resistance material 128 is also electrically connected to drain 122 of FET 118. The configuration of neuromorphic circuit 102 allows FET 118 to function as a diode, where an electrical connection between lines 114 and 110 is established in response to the voltage at gate 120 exceeding a threshold value. A portion of the variable resistance material 128 between drain 122 and junction 126 appears as resistor 128a, resulting in a voltage drop between line 114 and line 110 when an electrical connection is established through FET 118.

Similar to neuromorphic circuit 102, neuromorphic circuit 104 includes FET 130, where source 136 of FET 130 is electrically connected to line 112 at junction 137. At junction 138, gate 132 of FET 130 is electrically connected to variable resistance material 128 and to line 114. The variable resistance material 128 is also electrically connected to drain 134 of FET 130. A portion of the variable resistance material 128 between drain 134 and junction 138 appears as resistor 128b, resulting in a voltage drop between line 114 and line 112 when an electrical connection is established through FET 130. Sharing the variable resistance material 128 between both neuromorphic circuits 102 and 104 enables an area efficient design of synapse pairs. Although there is only one island of variable resistance material 128, this configuration leads effectively to two independent resistors 128a and 128b connected to FETs 118 and 130. Thus, on line 114, there are two FETs 118 and 130, each with their own resistors 128a and 128b. The pair of neuromorphic circuits 102 and 104 also supports distribution of an axon signal on line 114, which can then be modulated by the resistors 128a and 128b and distributed as dendrite signals on lines 110 and 112. The layout of neuromorphic circuits 102 and 104 can be extended horizontally and vertically to support a large number of synapse connections between neurons.

Neuromorphic circuits 106 and 108 represent another pair of neuromorphic circuits, with the same design as neuromorphic circuits 102 and 104. Neuromorphic circuit 106 includes FET 140, where source 146 of FET 140 is electrically connected to line 110 at junction 147. At junction 148, gate 142 of FET 140 is electrically connected to variable resistance material 150 and to line 116. The variable resistance material 150 is also electrically connected to drain 144 of FET 140. A portion of the variable resistance material 150 between drain 144 and junction 148 appears as resistor 150a, resulting in a voltage drop between line 116 and line 110 when an electrical connection is established through FET 140.

Neuromorphic circuit 108 includes FET 152, where source 158 of FET 152 is electrically connected to line 112 at junction 159. At junction 160, gate 154 of FET 152 is electrically connected to variable resistance material 150 and to line 116. The variable resistance material 150 is also electrically connected to drain 156 of FET 152. A portion of the variable resistance material 150 between drain 156 and junction 160 appears as resistor 150b, resulting in a voltage drop between line 116 and line 112 when an electrical connection is established through FET 152. Sharing the variable resistance material 150 between both neuromorphic circuits 106 and 108 enables an area efficient design of synapse pairs.

Figure 3:
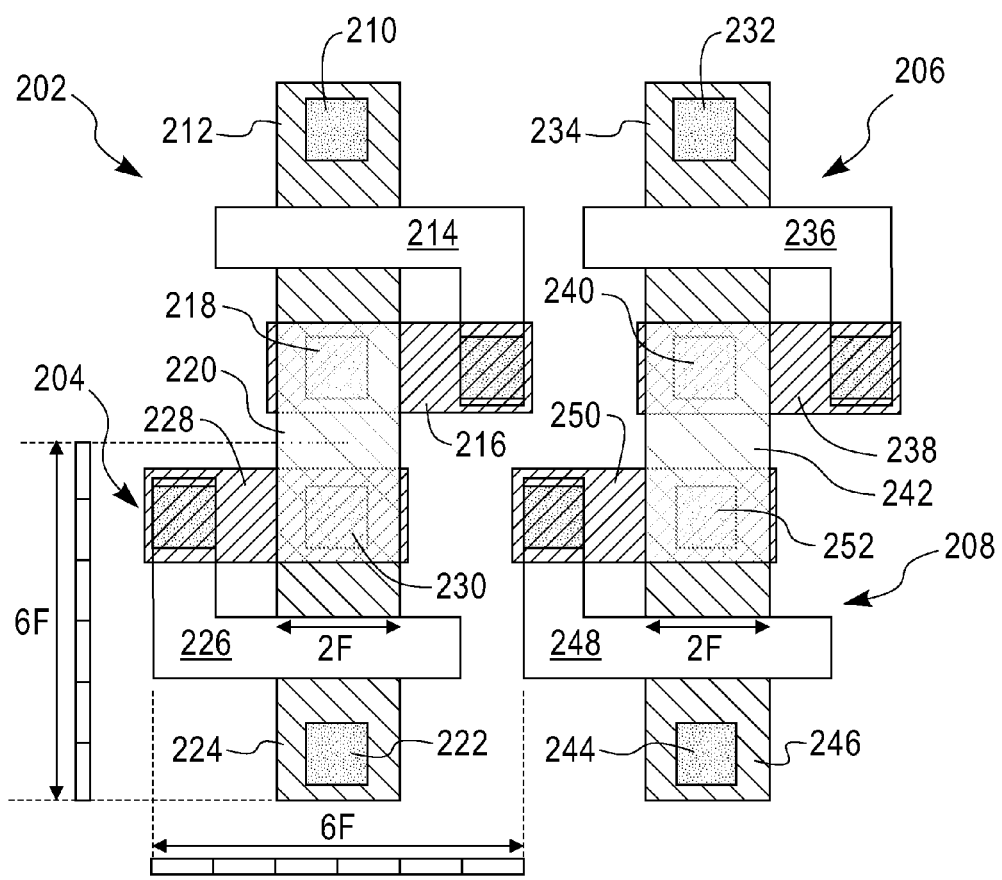
FIG. 3 depicts an example of an area efficient layout of the neuromorphic circuits of FIG. 2.

FIG. 3 depicts an example of an area efficient layout of the neuromorphic circuits of FIG. 2, where neuromorphic circuits 202, 204, 206, and 208 are equivalent to the neuromorphic circuits 102, 104, 106, and 108 of FIG. 2. Junction 210 is a connection point where neuromorphic circuit 202 connects to a dendrite line, such as junction 125 connecting to line 110 of FIG. 2. Junction 210 connects to conductive path 212, which is gated by semiconductor 214. The semiconductor 214 is equivalent to the gate 120 of FET 118 of FIG. 2. Although referred to semiconductor 214, the gate 120 of FET 118 of FIG. 2 may be implemented in poly-silicon in one embodiment. Metal line 216 electrically connects the semiconductor 214 to junction 218, where junction 218 is equivalent to junction 126 of FIG. 2. Junction 218 is also connected to an island of variable resistance material 220. Junction 218 is a connection point where neuromorphic circuit 202 connects to an axon line, such as line 114 of FIG. 2.

Similar to neuromorphic circuit 202, neuromorphic circuit 204 connects to a dendrite line, such as line 112 of FIG. 2, at junction 222. Junction 222 is equivalent to junction 137 of FIG. 2 and connects to conductive path 224, which is gated by semiconductor 226. The semiconductor 226 is equivalent to the gate 132 of FET 130 of FIG. 2. Again, semiconductor 226 may alternatively be implemented in poly-silicon. Metal line 228 electrically connects the semiconductor 226 to junction 230, where junction 230 is equivalent to junction 138 of FIG. 2. Junction 230 is also connected to the island of variable resistance material 220. Junction 230 is a connection point where neuromorphic circuit 204 connects to an axon line, such as line 114 of FIG. 2. Sharing the island of variable resistance material 220 between both neuromorphic circuits 202 and 204 enables an area efficient design of synapse pairs.

Neuromorphic circuits 206 and 208 represent another pair of neuromorphic circuits, with the same design as neuromorphic circuits 202 and 204. Neuromorphic circuit 206 connects to a dendrite line, such as line 110 of FIG. 2, at junction 232. Junction 232 is equivalent to junction 147 of FIG. 2 and connects to conductive path 234, which is gated by semiconductor 236. The semiconductor 236 is equivalent to the gate 142 of FET 140 of FIG. 2. Metal line 238 electrically connects the semiconductor 236 to junction 240, where junction 240 is equivalent to junction 148 of FIG. 2. Junction 240 is also connected to an island of variable resistance material 242. Junction 240 is a connection point where neuromorphic circuit 206 connects to an axon line, such as line 116 of FIG. 2. Neuromorphic circuit 208 connects to a dendrite line, such as line 112 of FIG. 2, at junction 244. Junction 244 is equivalent to junction 159 of FIG. 2 and connects to conductive path 246, which is gated by semiconductor 248. The semiconductor 248 is equivalent to the gate 154 of FET 152 of FIG. 2. Metal line 250 electrically connects the semiconductor 248 to junction 252, where junction 252 is equivalent to junction 160 of FIG. 2. Junction 252 is also connected to the island of variable resistance material 242. Junction 252 is a connection point where neuromorphic circuit 208 connects to an axon line, such as line 116 of FIG. 2. Sharing the island of variable resistance material 242 between both neuromorphic circuits 206 and 208 enables an area efficient design of synapse pairs.

As can be seen in FIG. 3, the layout of each of the neuromorphic circuits 202-208 fits within thirty-six features-squared (six features long and six features wide), where the conductive paths 212, 224, 234, and 246 are each two features wide. A portion of the island of variable resistance material 220 fits within the 6×6 area of neuromorphic circuits 202, while the remaining portion of the island of variable resistance material 220 fits within the adjacent 6×6 area of neuromorphic circuits 204. Here, a "feature" is sized relative to the implementing technology. For example, a feature size can be 32 nm, 45 nm, 90 nm, and so forth depending upon the semiconductor manufacturing processes used. As semiconductor manufacturing processes are further refined, smaller feature sizes such as 22 nm, 16 nm, 11 nm, and so forth can be used to implement the neuromorphic circuits 202-208. The exemplary layouts depicted in FIG. 3 provide for spacing margin between the neuromorphic circuits 202-208 and overlapping of elements in the neuromorphic circuits 202-208. The pair of neuromorphic circuits 202 and 204 sharing the island of variable resistance material 220 may have an opposite orientation relative to each other. For instance, the semiconductor 214 may extend two features to the right of the island of variable resistance material 220, while semiconductor 226 extends two features to the left of the island of variable resistance material 220. The pair of neuromorphic circuits 206 and 208 may have the same orientation as the pair of neuromorphic circuits 202 and 204, which enables the pairs to be closely aligned to each other.

Figure 4:
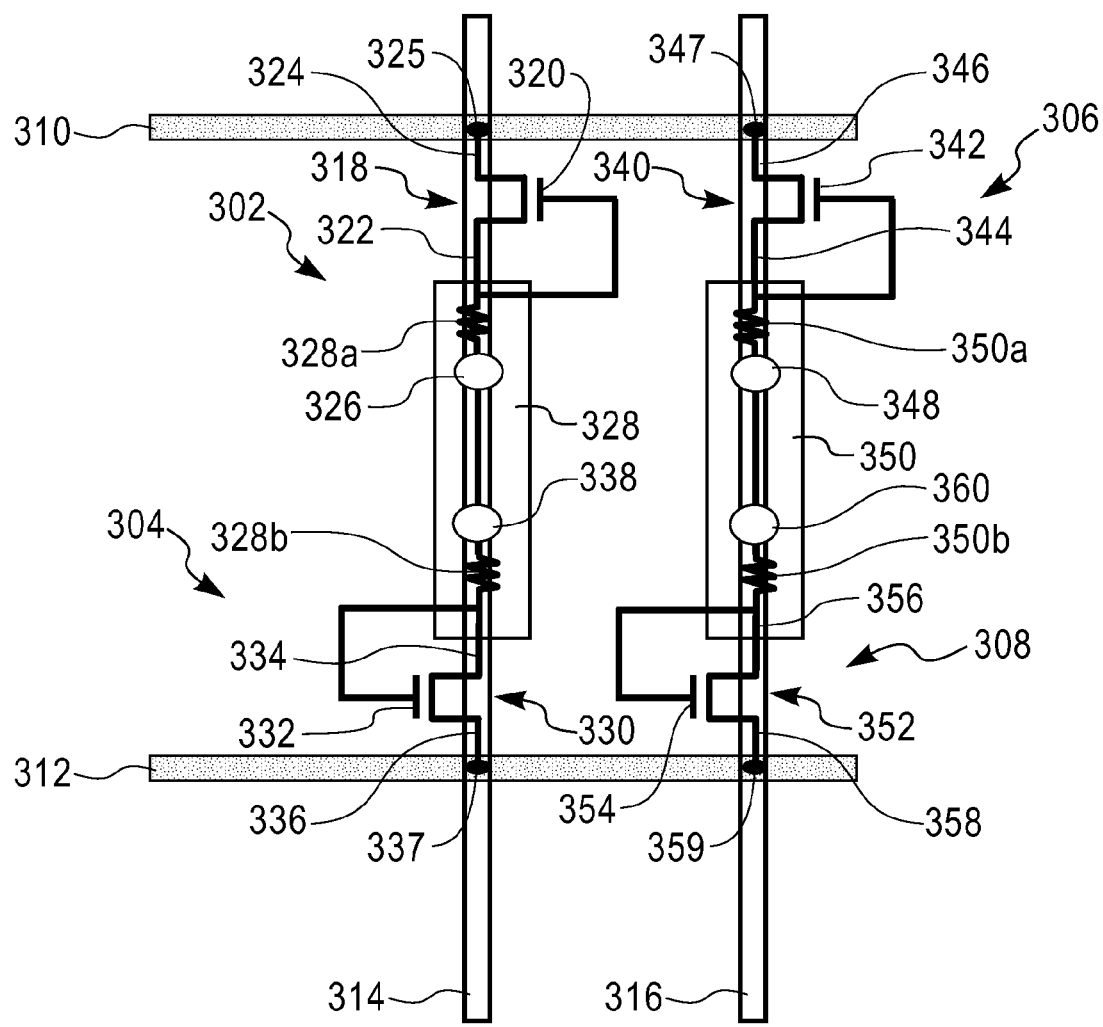
FIG. 4 depicts another example of neuromorphic circuits that may be implemented in exemplary embodiments.

FIG. 4 depicts another example of neuromorphic circuits using variable resistance material that may be implemented in exemplary embodiments. Similar to FIG. 2, FIG. 4 depicts four neuromorphic circuits 302, 304, 306, and 308 in a crossbar configuration. Lines 310 and 312 represent dendrite connections, and lines 314 and 316 represent axon connections, where signals flow from axons to dendrites between neurons circuits in an artificial neural network. Each of the neuromorphic circuits 302-308 includes a FET in a diode-configuration. For example, neuromorphic circuit 302 includes FET 318, where gate 320 of FET 318 is electrically connected to drain 322 of FET 318 and source 324 of FET 318 is electrically connected to line 310 at junction 325. At junction 326, variable resistance material 328 is electrically connected to line 314. However, in contrast to FIG. 2, the gate 320 of FET 318 does not connect to junction 326; instead, gate 320 connects to the drain 322 of FET 318 external to the variable resistance material 328. This embodiment may increase the voltage required on line 314 to exceed a threshold value of the gate 320 of FET 302, as a voltage drop across the variable resistance material 328 may occur prior to gate 320. The variable resistance material 328 is also electrically connected to drain 322 of FET 318. The configuration of neuromorphic circuit 302 still allows FET 318 to function as a diode, where an electrical connection between lines 314 and 310 is established in response to the voltage at gate 320 exceeding the threshold value for switching. A portion of the variable resistance material 328 between drain 322 and junction 326 appears as resistor 328a, resulting in a voltage drop between line 314 and line 310 when an electrical connection is established through FET 318.

Similar to neuromorphic circuit 302, neuromorphic circuit 304 includes FET 330, where gate 332 of FET 330 is electrically connected to drain 334 of FET 330 and source 336 of FET 330 is electrically connected to line 312 at junction 337. At junction 338, the variable resistance material 328 is electrically connected to line 314. Again, gate 332 connects to the drain 334 of FET 330 external to the variable resistance material 328, and gate 332 is not directly connected to junction 338. The variable resistance material 328 is also electrically connected to drain 334 of FET 330. A portion of the variable resistance material 328 between drain 334 and junction 338 appears as resistor 328b, resulting in a voltage drop between line 314 and line 312 when an electrical connection is established through FET 330. Sharing the variable resistance material 328 between both neuromorphic circuits 302 and 304 enables an area efficient design of synapse pairs. Although there is only one island of variable resistance material 328, this configuration leads effectively to two independent resistors 328a and 328b connected to FETs 318 and 330. Thus on line 314, there are two FETs 318 and 330, each with their own resistors 328a and 328b. The pair of neuromorphic circuits 302 and 304 also supports distribution of an axon signal on line 314 to be simultaneously distributed as dendrite signals on lines 310 and 312. The layout of neuromorphic circuits 302 and 304 can be extended horizontally and vertically to support a large number of synapse connections between neurons.

Neuromorphic circuits 306 and 308 represent another pair of neuromorphic circuits, with the same design as neuromorphic circuits 302 and 304. Neuromorphic circuit 306 includes FET 340, where gate 342 of FET 340 is electrically connected to drain 344 of FET 340, and source 346 of FET 340 is electrically connected to line 310 at junction 347. Again, gate 342 connects to the drain 344 of FET 340 external to variable resistance material 350, and gate 342 is not directly connected to junction 348. The variable resistance material 350 is also electrically connected to drain 344 of FET 340. A portion of the variable resistance material 350 between drain 344 and junction 348 appears as resistor 350a, resulting in a voltage drop between line 316 and line 310 when an electrical connection is established through FET 340. Neuromorphic circuit 308 includes FET 352, where gate 354 of FET 352 is electrically connected to drain 356 of FET 352, and source 358 of FET 352 is electrically connected to line 312 at junction 359. Gate 354 connects to the drain 356 of FET 352 external to variable resistance material 350, and gate 354 is not directly connected to junction 360. The variable resistance material 350 is also electrically connected to drain 356 of FET 352. A portion of the variable resistance material 350 between drain 356 and junction 360 appears as resistor 350*b*, resulting in a voltage drop between line 316 and line 312 when an electrical connection is established through FET 352. Sharing the variable resistance material 350 between both neuromorphic circuits 306 and 308 enables an area efficient design of synapse pairs.

Figure 5:
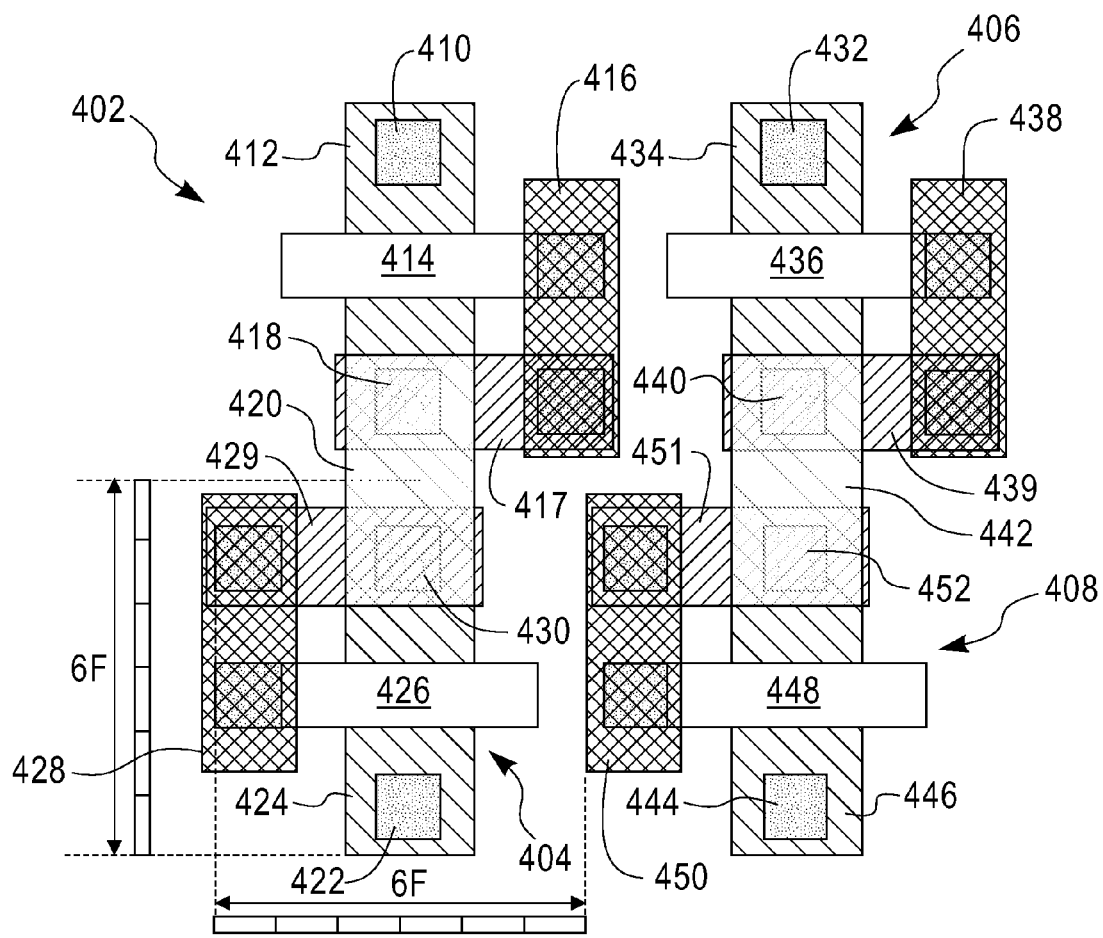
FIG. 5 depicts an example of an area efficient layout of the neuromorphic circuits of FIG. 4.

FIG. 5 depicts an example of an area efficient layout of the neuromorphic circuits of FIG. 4, where neuromorphic circuits 402, 404, 406, and 408 are equivalent to the neuromorphic circuits 302, 304, 306, and 308 of FIG. 4. Junction 410 is a connection point where neuromorphic circuit 302 connects to a dendrite line, such as line 310 of FIG. 4. Junction 410 is equivalent to junction 325 of FIG. 4 and connects to conductive path 412, which is gated by semiconductor 414. The semiconductor 414 is equivalent to the gate 320 of FET 318 of FIG. 4. Metal line 416 electrically connects the semiconductor 414 to metal line 417, which is in turn connected to an island of variable resistance material 420. Junction 418 is equivalent to junction 326 of FIG. 4, connecting the island of variable resistance material 420 of neuromorphic circuit 402 to an axon line, such as line 314 of FIG. 4. Thus, electrical current flowing from an axon line passes through junction 418 and the island of variable resistance material 420 before continuing on metal lines 417 and 416 to reach semiconductor 414. This results in a voltage drop across the island of variable resistance material 420 prior to a gate (e.g., gate 320 of FIG. 4) of the semiconductor 414.

Similar to neuromorphic circuit 402, neuromorphic circuit 404 connects to a dendrite line, such as line 312 of FIG. 4, at junction 422. Junction 422 is equivalent to junction 337 of FIG. 4 and connects to conductive path 424, which is gated by semiconductor 426. The semiconductor 426 is equivalent to the gate 332 of FET 330 of FIG. 4. Metal line 428 electrically connects the semiconductor 426 to metal line 429, which is in turn connected to the island of variable resistance material 420. Junction 430 is equivalent to junction 338 of FIG. 4, connecting the island of variable resistance material 420 of neuromorphic circuit 404 to an axon line, such as line 314 of FIG. 4. Sharing the island of variable resistance material 420 between both neuromorphic circuits 402 and 404 enables an area efficient design of synapse pairs.

Neuromorphic circuits 406 and 408 represent another pair of neuromorphic circuits, with the same design as neuromorphic circuits 402 and 404. Neuromorphic circuit 406 connects to a dendrite line, such as line 310 of FIG. 4, at junction 432. Junction 432 is equivalent to junction 347 of FIG. 4 and connects to conductive path 434, which is gated by semiconductor 436. The semiconductor 436 is equivalent to the gate 342 of FET 340 of FIG. 4. Metal line 438 electrically connects the semiconductor 436 to metal line 439, which is in turn connected to an island of variable resistance material 442. Junction 440 is equivalent to junction 348 of FIG. 4, connecting the island of variable resistance material 442 of neuromorphic circuit 406 to an axon line, such as line 316 of FIG. 4. Thus, electrical current flowing from an axon line passes through junction 440 and the island of variable resistance material 442 before continuing on metal lines 439 and 438 to reach semiconductor 436.

Neuromorphic circuit 408 connects to a dendrite line, such as line 312 of FIG. 4, at junction 444. Junction 444 is equivalent to junction 359 of FIG. 4 and connects to conductive path 446, which is gated by semiconductor 448. The semiconductor 448 is equivalent to the gate 354 of FET 352 of FIG. 4. Metal line 450 electrically connects the semiconductor 448 to metal line 451, which is in turn connected to the island of variable resistance material 442. Junction 452 is equivalent to junction 360 of FIG. 4, connecting the island of variable resistance material 442 of neuromorphic circuit 408 to an axon line, such as line 316 of FIG. 4. Sharing the island of variable resistance material 442 between both neuromorphic circuits 406 and 408 enables an area efficient design of synapse pairs.

As can be seen in FIG. 5, the layout of each of the neuromorphic circuits 402-408 fits within six features-squared (six features long and six features wide), where the conductive paths 412, 424, 434, and 446 are each two features wide. Thus, FIG. 5 has a similar area-efficient layout as FIG. 3, and can be scaled according to a semiconductor manufacturing process used to implement the neuromorphic circuits 402-408 as described in reference to FIG. 3. It will also be understood that each pair of neuromorphic circuits 402/404, and 406/408 can be referred to collectively as a neuromorphic circuit implementing two synapses or synapse devices.

Figure 6:
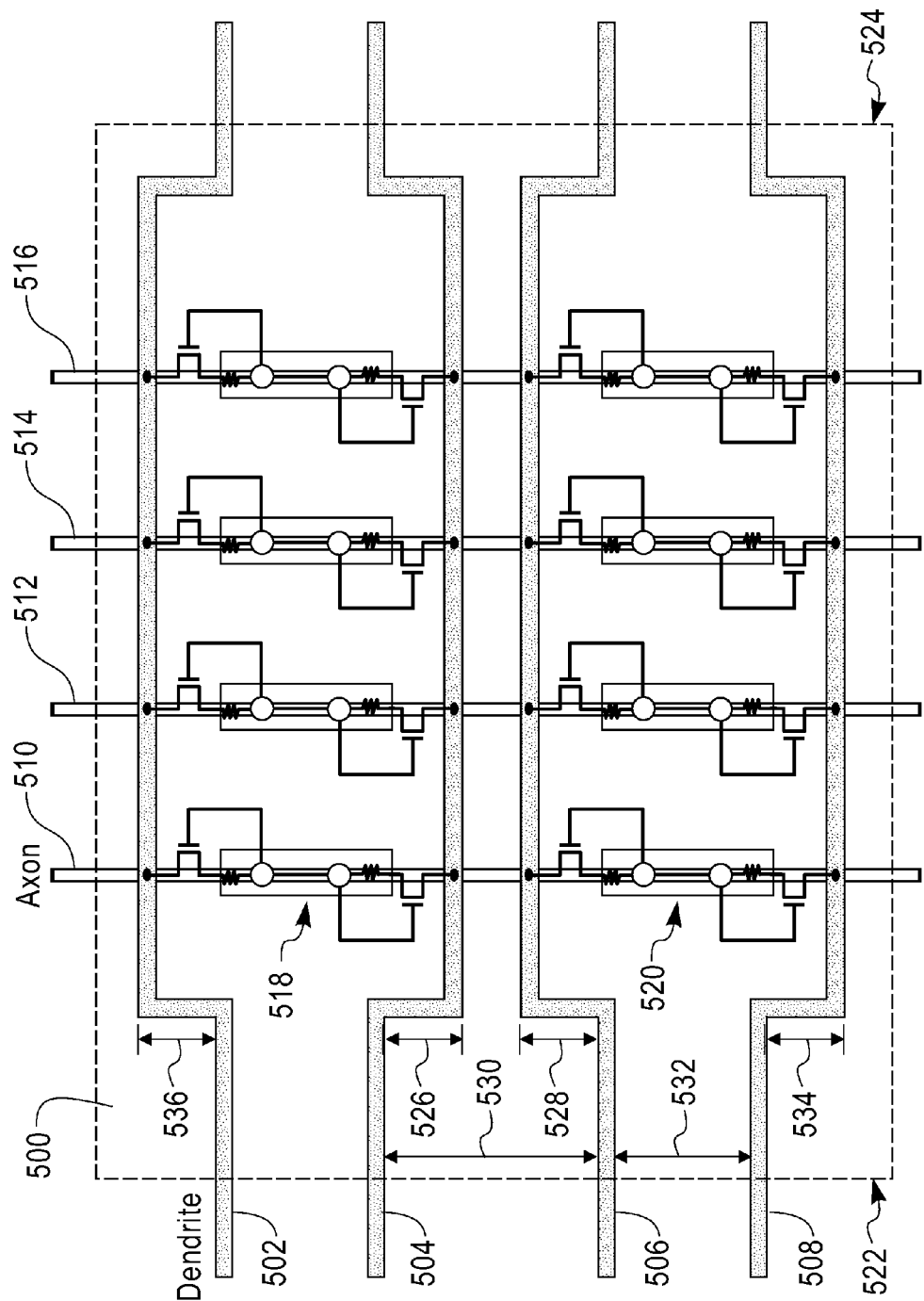
FIG. 6 depicts an example of a synapse block of neuromorphic circuits that may be implemented in exemplary embodiments.

FIG. 6 depicts an example of a synapse block 500 of neuromorphic circuits that may be implemented in exemplary embodiments. The synapse block 500 enables crossbar connections of four dendrite lines 502, 504, 506, and 508 with four axon lines 510, 512, 514, and 516. Neuromorphic circuits in synapse block 500 are paired between separate dendrite lines and axon lines. For example, neuromorphic circuit 518 is paired between dendrite line 502 and dendrite line 504, and neuromorphic circuit 520 is paired between dendrite line 506 and dendrite line 508. Both neuromorphic circuits 518 and 520 share axon line 510. Each neuromorphic circuit 518 and 520 models two synapses. In the example of FIG. 6, neuromorphic circuits 518 and 520 are each equivalent to pairs of neuromorphic circuits 102 and 104 of FIG. 2. However, either or both of the neuromorphic circuits 518 and 520 can be implemented as pairs of neuromorphic circuits 302 and 304 of FIG. 4. Between each pair of dendrite lines 502 and 504, as well as each pair of dendrite lines 506 and 508, neuromorphic circuit pairs are distributed along axon lines 510-516, such that the synapse block 500 models sixteen synapses. In general, the synaptic density of synapse block 500 is equal to the number of axon lines multiplied by the number of dendrite lines entering the synapse block 500, divided by the physical area of the synapse block 500.

To efficiently space the dendrite lines 502-508, the dendrite lines 502-508 may be shifted within the synapse block 500 such that the dendrite lines 502-508 are evenly distributed at external interfaces 522 and 524 of synapse block 500. For instance, dendrite line 504 may be shifted by offset 526, and dendrite line 506 can be shifted by offset 528. Offsets 526 and 528 can be equal in magnitude but opposite in direction, such that external spacing 530 between dendrite lines 504 and 506 is equivalent to external spacing 532 between dendrite lines 506 and 508. Similarly, dendrite line 508 can be shifted by offset 534, and dendrite line 502 can be shifted by offset 536, where offset 534 is equivalent to offset 526, and offset 536 is equivalent to offset 528. The evenly distributed spacing of dendrite lines 502-508 at external interfaces 522 and 524 may enable a compact internal layout of the synapse block 500 while allowing for spacing margin in placement of neuron circuit blocks, in addition to supporting a modular design.

Figure 7:
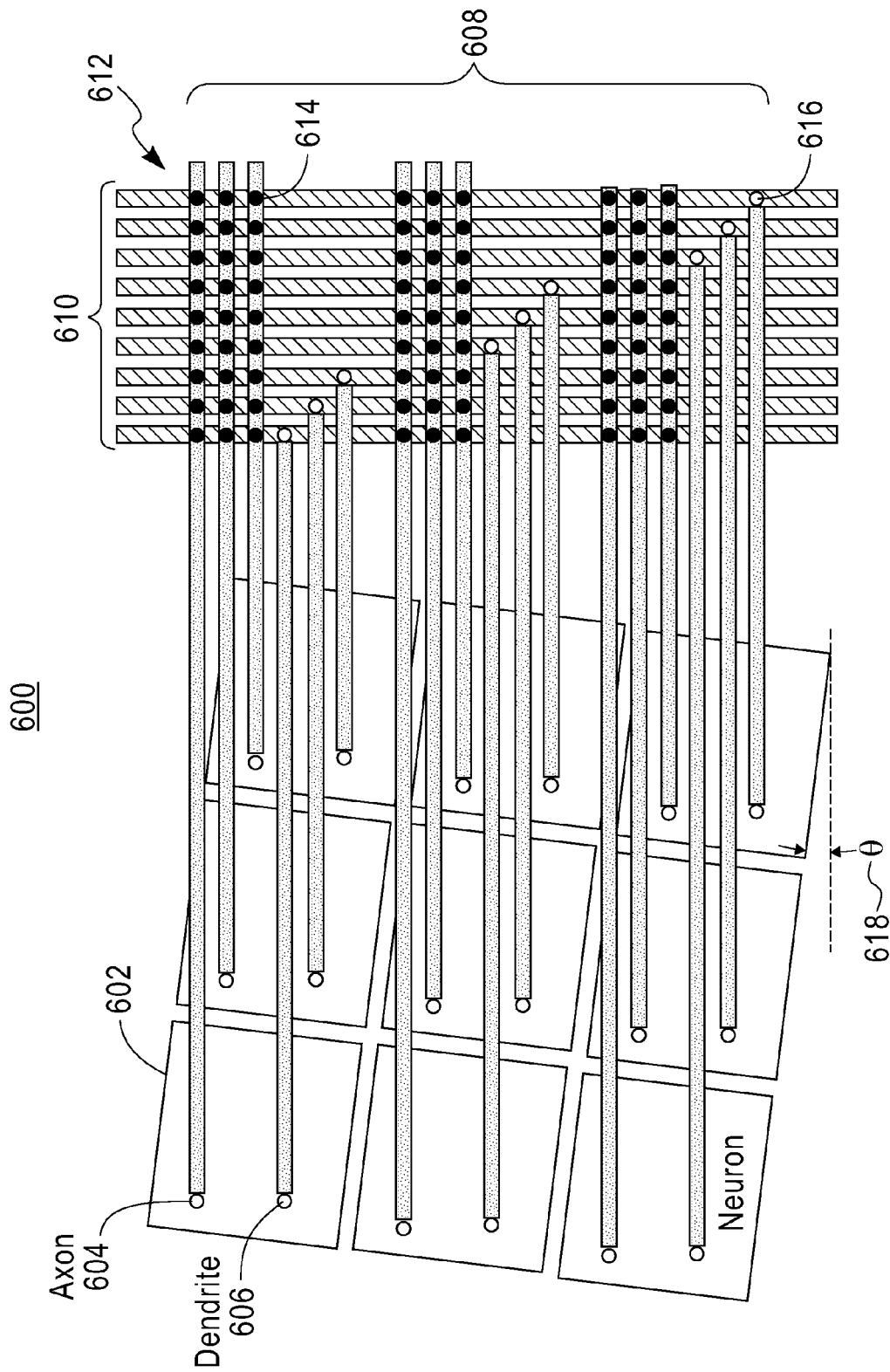
FIG. 7 depicts an example of a system of neurons crossbar interconnected to synapses using neuromorphic circuits that may be implemented in exemplary embodiments.

FIG. 7 depicts an example of a system 600 of neurons crossbar interconnected to synapses using neuromorphic circuits that may be implemented in exemplary embodiments. The system 600 includes multiple neuron circuit blocks 602 with interconnected axons 604 and dendrites 606. Horizontal lines 608 connect the axons 604 and dendrites 606 to vertical lines 610 of crossbar connection grid 612. Synapse blocks 614 may control propagation of signals between the axons 604 and vertical lines 610. Connectors 616 can be used to pass signals from the vertical lines 610 to the dendrites 606. The synapse block 614 can be implemented as depicted in FIGS. 2-5, where phase change material is used as programmable resistors in modeling synapse performance. The system 600 of FIG. 7 enables simultaneous communication between an axon of a given neuron circuit block and the dendrites of all other neuron circuit blocks. Orienting the neuron circuit blocks 602 at an angle theta 618 relative to horizontal lines 608 as an axis of reference allows the axons 604 and dendrites 606 of each of the neuron circuit blocks 602 to be placed at a common location in each of the neuron circuit blocks 602, while maintaining a Manhattan grid structure in the crossbar connection grid 612. Therefore, a common design can be used for each of the neuron circuit blocks 602.

Figure 8:
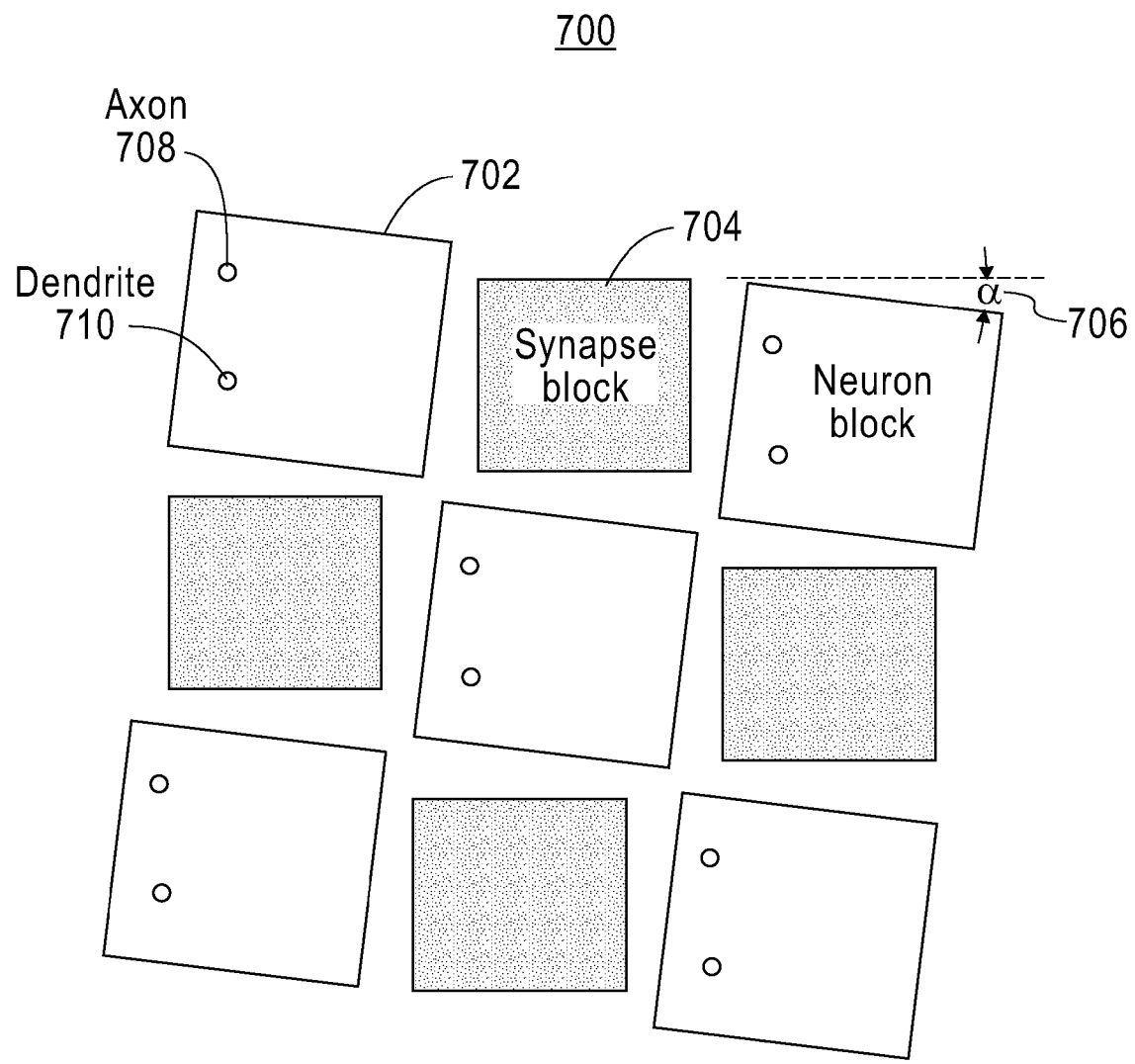
FIG. 8 depicts an example layout of neuron circuit blocks and synapse blocks that may be implemented in exemplary embodiments.

FIG. 8 depicts an example layout 700 of neuron circuit blocks 702 and synapse blocks 704 that may be implemented in exemplary embodiments. In layout 700, the neuron circuit blocks 702 may be equivalent to the neuron circuit blocks 602 of FIG. 7, and the synapse blocks 704 may be equivalent to synapse block 500 of FIG. 6. Rather than using a crossbar connection grid shifted to the side of the neuron circuit blocks 702, layout 700 distributes up to four synapse blocks 704 adjacent to each of the neuron circuit blocks 702 in a planar tiled configuration. Similar to the neuron circuit blocks 602 of FIG. 7, the neuron circuit blocks 702 can be oriented at an angle alpha 706 relative to the synapse blocks 704 to maintain constant relative positioning of axon 708 and dendrite 710 in each of the neuron circuit blocks 702.

Figure 9:
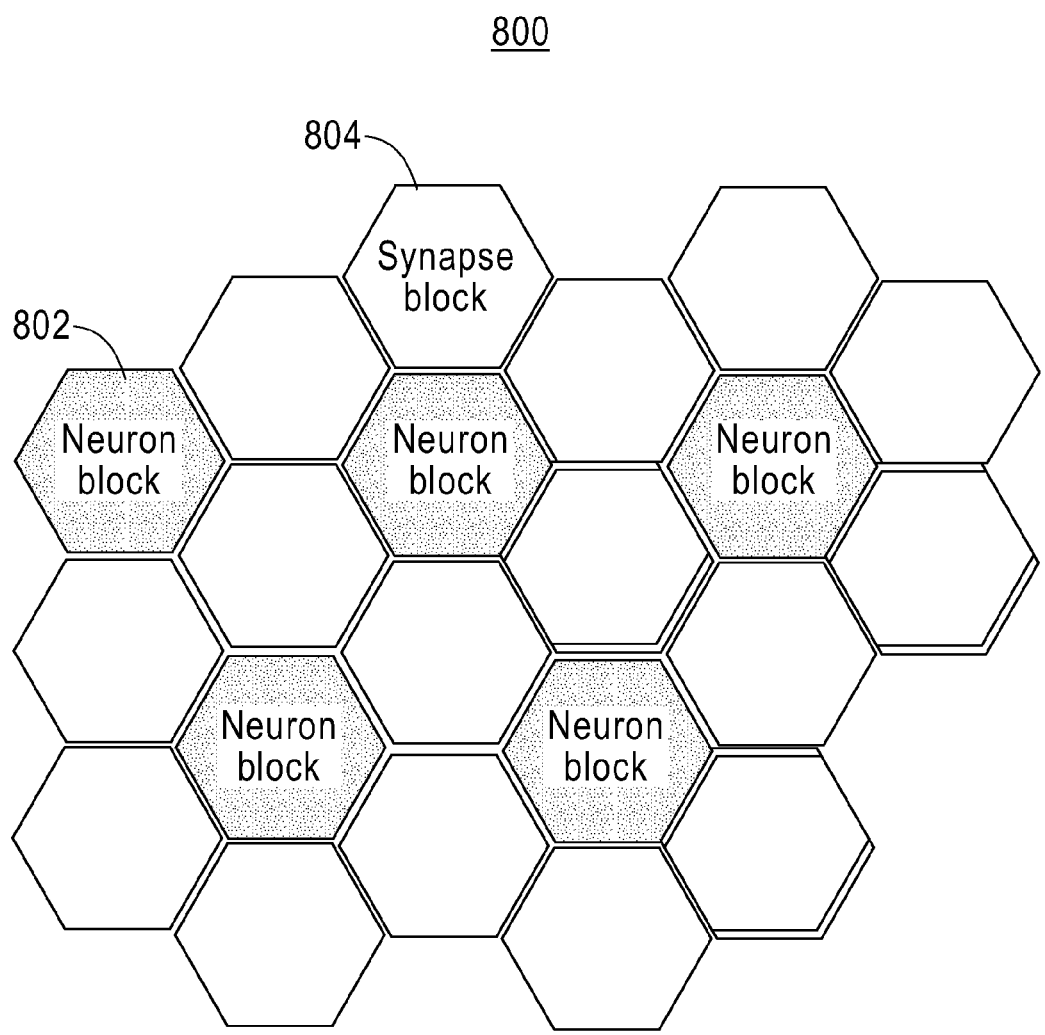
FIG. 9 depicts another example layout of neuron circuit blocks and synapse blocks that may be implemented in exemplary embodiments.

FIG. 9 depicts another example layout 800 of neuron circuit blocks 802 and synapse blocks 804 that may be implemented in exemplary embodiments. The example of layout 800 enables up to six synapse blocks 804 to be placed adjacent to each of the neuron circuit blocks 802 in another planar tiled configuration. Here, each of the synapse blocks 804 can implement neuromorphic circuits with variable resistance material as described in FIGS. 2-5; however, a hexagonal tile area is used rather than a square or rectangular tile area.

Figure 10:
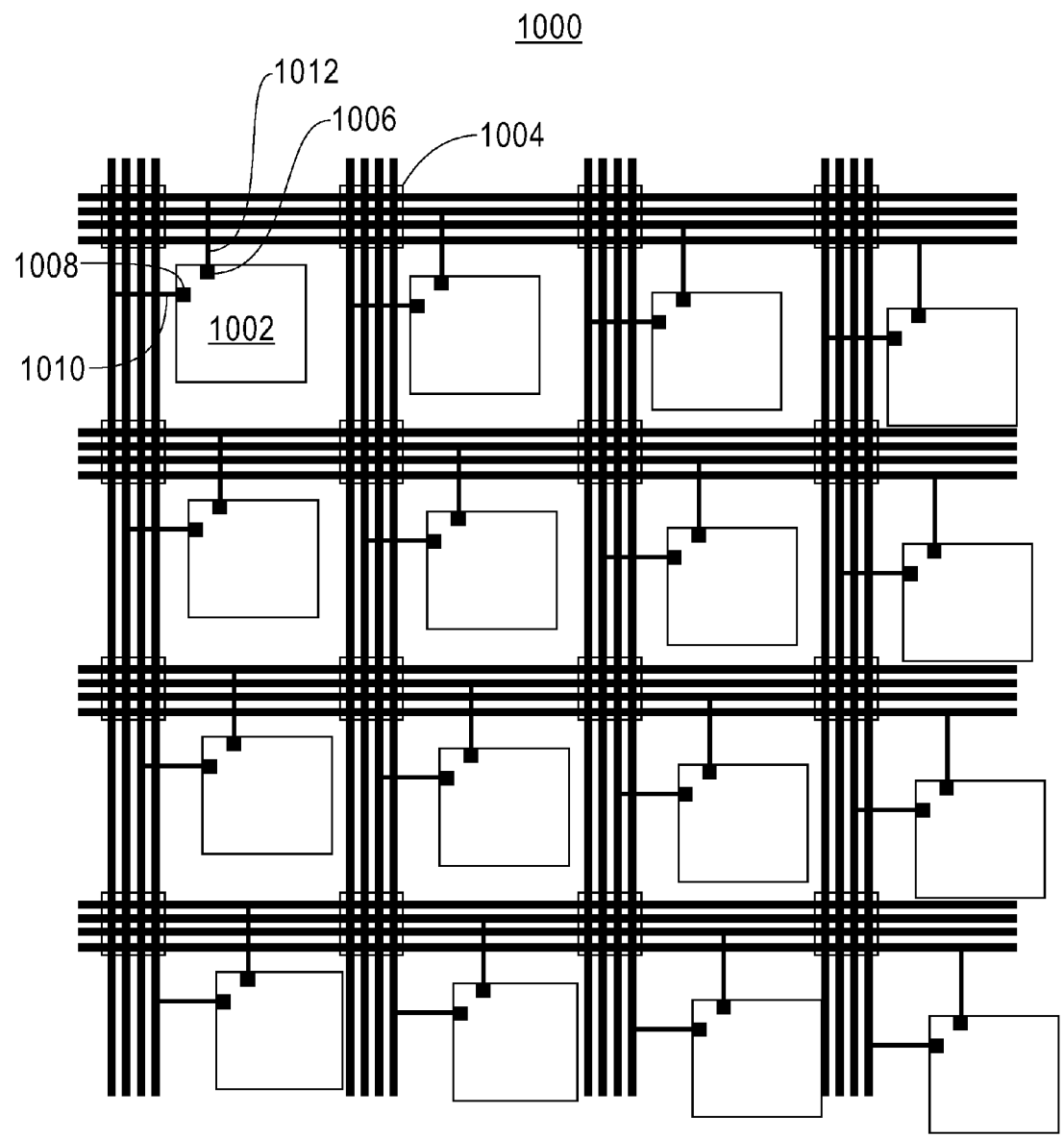
FIG. 10 depicts an additional example layout of neuron circuit blocks and synapse blocks that may be implemented in exemplary embodiments.

FIG. 10 depicts an additional example layout 1000 of neuron circuit blocks 1002 and synapse blocks 1004 that may be implemented in exemplary embodiments. In layout 1000, the neuron circuit blocks 1002 may be equivalent to the neuron circuit blocks 602 of FIG. 7, and the synapse blocks 1004 may be equivalent to synapse block 500 of FIG. 6. Rather than using a crossbar connection grid shifted to the side or embedded in the neuron circuit blocks 1002, layout 1000 places the synapse blocks 1004 between the neuron circuit blocks 1002, similar to layout 700 of FIG. 8. In layout 1000, all of the synapse blocks 1004 are in a fixed grid distribution, but the neuron circuit blocks 1002 are staggered to enable common relative positioning of axons 1006 and dendrites 1008. To interconnect all of the neuron circuit blocks 1002 and synapse blocks 1004, local interconnection wires 1010 and 1012 may be laid out shifted relative to a Manhattan grid.

Figure 11:
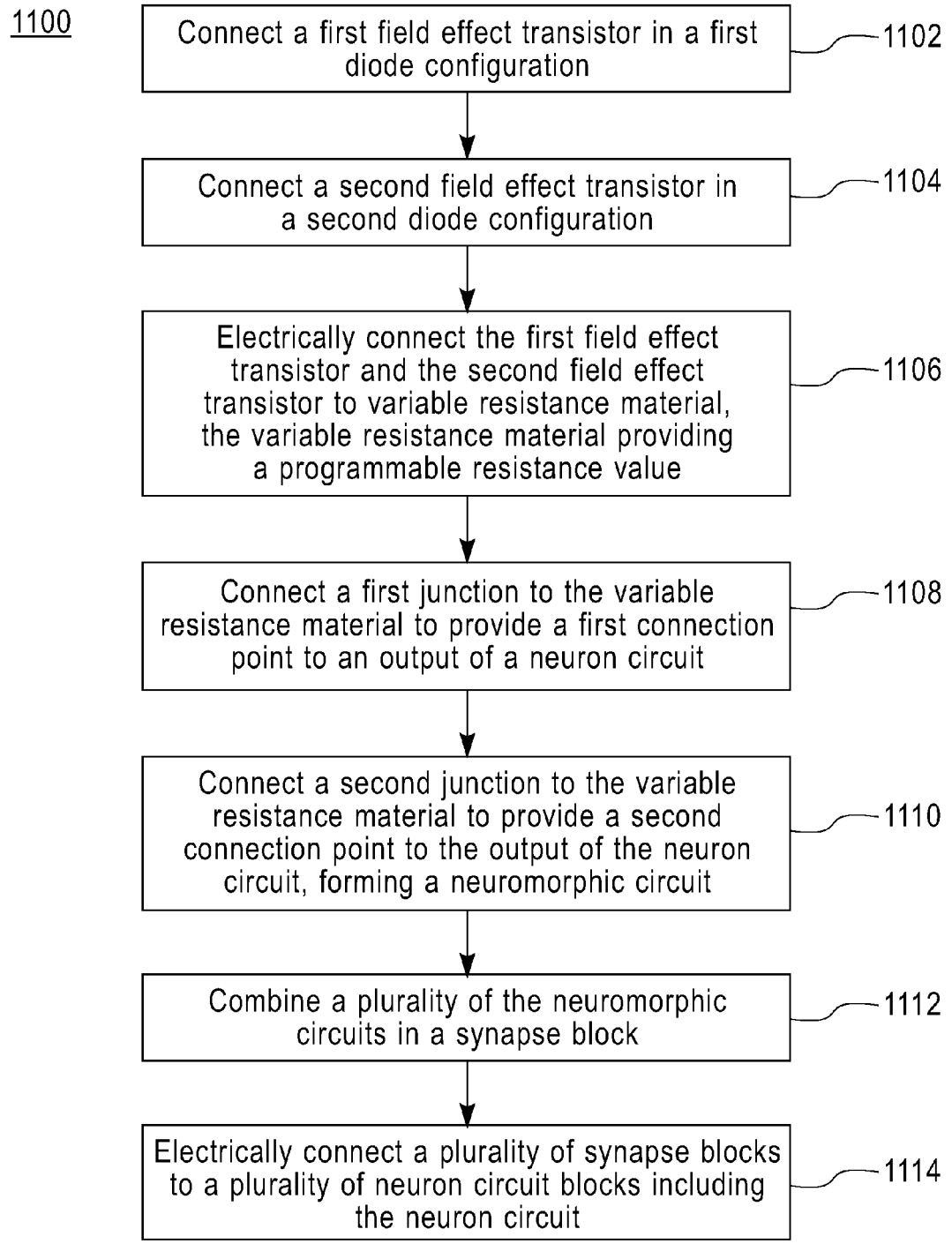
FIG. 11 depicts an example of a process for implementing a system of area efficient neuromorphic circuits in exemplary embodiments.

FIG. 11 depicts an example of a process 1100 for implementing a system of area efficient neuromorphic circuits using variable resistance material. At block 1102, a first field effect transistor is connected in a first diode configuration. At block 1104, a second field effect transistor is connected in a second diode configuration. Diode configurations of FETs can be implemented as previously described in reference to FIGS. 2-5. At block 1106, the first field effect transistor and the second field effect transistor are electrically connected to an island of variable resistance material. The island of variable resistance material provides a programmable resistance value. At block 1108, a first junction is connected to the island of variable resistance material to provide a first connection point to an output of a neuron circuit. At block 1110, a second junction is connected to the island of variable resistance material to provide a second connection point to the output of the neuron circuit, forming a neuromorphic circuit.

For example, FETs 118 and 130 can be electrically connected to the variable resistance material 128 to provide a current path from junction 126 to gate 120 that bypasses the variable resistance material 128 and a second current path from junction 138 to gate 132 that bypasses the variable resistance material 128. As an alternate example, FETs 318 and 330 can be electrically connected to the variable resistance material 328 to provide a current path from junction 326 to gate 320 that passes through the variable resistance material 328 and a second current path from junction 338 to gate 332 that passes through the variable resistance material 328. Junctions 126 and 138 can connect to a common line 114, which provides an electrical connection to an output (axon) of a neuron circuit, such as axon 906 of neuron circuit block 902 of FIG. 10. Junction 125 establishes an electrical connection between FET 118 and any neuron circuit inputs (dendrites) on line 110, while junction 137 establishes an electrical connection between FET 130 and any neuron circuit inputs (dendrites) on line 112.

At block 1112, a plurality of the neuromorphic circuits is combined in a synapse block. An example of this is depicted in FIG. 6, where one or more connections to the neuromorphic circuits 518 and 520 are offset to evenly distribute the one or more connections to external interfaces 522 and 524 of synapse block 500. At block 1114, a plurality of synapse blocks is electrically connected to a plurality of neuron circuit blocks including the neuron circuit, as previously described in reference to FIGS. 7-10.

Figure 12:
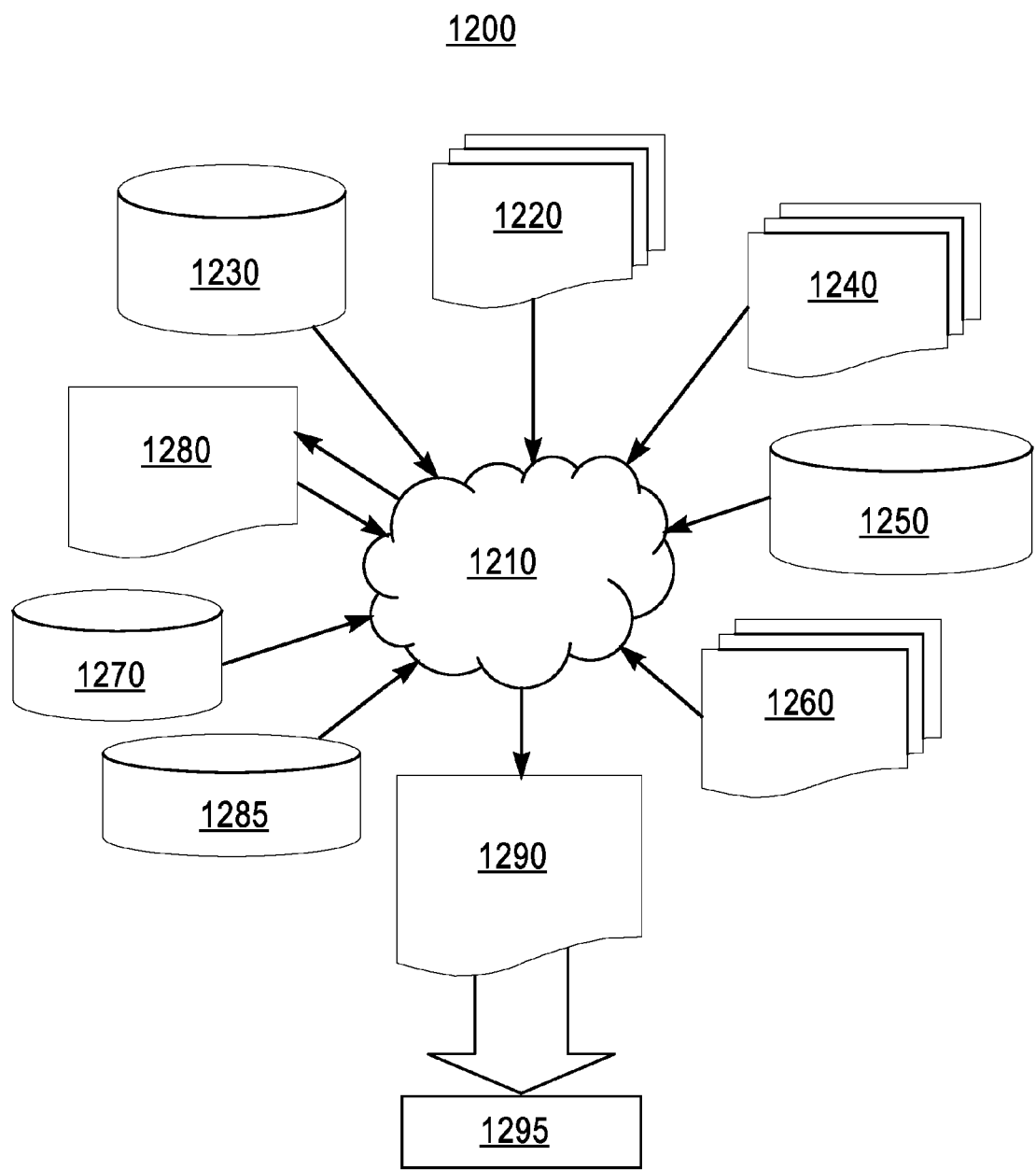
FIG. 12 is a flow diagram of a design process used in semiconductor design, manufacture, and/or test.

FIG. 12 shows a block diagram of an exemplary design flow 1200 used for example, in semiconductor IC logic design, simulation, test, layout, and manufacture. Design flow 1200 includes processes and mechanisms for processing design structures or devices to generate logically or otherwise functionally equivalent representations of the design structures and/or devices described above and shown in FIGS. 1-11. The design structures processed and/or generated by design flow 1200 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 1200 may vary depending on the type of representation being designed. For example, a design flow 1200 for building an application specific IC (ASIC) may differ from a design flow 1200 for designing a standard component.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1-11. As such, design structure 1220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1-11 to generate a netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 1290 may comprise a compiled, executable HDL simulation model that functionally simulates the devices shown in FIGS. 1-11.

Design structure 1290 may also employ a data format used for the exchange of layout data of integrated circuits and/or symbolic data format (e.g. information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 1290 may then proceed to a stage 1295 where, for example, design structure 1290: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Technical effects include area efficient implementations of neuromorphic circuits using variable resistance material. Sharing a common block or island of variable resistance material between multiple neuromorphic circuits, enables an efficient layout to model synapses as part of an artificial neural network. Grouping multiple neuromorphic circuits into synapse blocks allows for a number of potential orientations to interconnect with multiple neuron circuit blocks having a common design.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A neuromorphic system comprising:
    a plurality of synapse blocks electrically connected to a plurality of neuron circuit blocks, the plurality of synapse blocks comprising a plurality of neuromorphic circuits arranged in a crossbar configuration, each neuromorphic circuit comprising:
        a field effect transistor in a diode configuration electrically connected to variable resistance material, the variable resistance material providing a programmable resistance value;
        a first junction electrically connected to the variable resistance material and an output of one or more of the neuron circuit blocks; and
        a second junction electrically connected to the field effect transistor and an input of one or more of the neuron circuit blocks.

2. The neuromorphic system of claim 1 wherein the plurality of neuron circuit blocks are further comprised of axons to output signals and dendrites to receive signals, the axons and dendrites positioned at common locations across each of the neuron circuit blocks.

3. The neuromorphic system of claim 2 wherein the plurality of neuron circuit blocks are oriented at an angle relative to the plurality of synapse blocks.

4. The neuromorphic system of claim 1 wherein at least one of the synapse blocks is embedded within at least one of the neuron circuit blocks.

5. The neuromorphic system of claim 1 wherein four or more of the synapse blocks are adjacent to at least one of the neuron circuit blocks in a planar tile configuration.

6. The neuromorphic system of claim 1 wherein the synapse blocks are staggered such that a positional shift of at least one horizontal or vertical connection point occurs between adjacent synapse blocks.

7. A method for implementing an area efficient neuromorphic system, comprising:
    electrically connecting a plurality of synapse blocks to a plurality of neuron circuit blocks, the plurality of synapse blocks comprising a plurality of neuromorphic circuits, each neuromorphic circuit implemented by:
        electrically connecting a field effect transistor in a diode configuration to variable resistance material, the variable resistance material providing a programmable resistance value;
        electrically connecting a first junction to the variable resistance material and an output of one or more of the neuron circuit blocks; and
        electrically connecting a second junction to the field effect transistor and an input of one or more of the neuron circuit blocks.

8. The method of claim 7 wherein the plurality of neuron circuit blocks are further comprised of axons to output signals and dendrites to receive signals, and the method further comprises:
    positioning the axons and dendrites at common locations across each of the neuron circuit blocks.

9. The method of claim 8 further comprising:
    orienting the plurality of neuron circuit blocks at an angle relative to the plurality of synapse blocks.

10. The method of claim 7 further comprising:
    embedding at least one of the synapse blocks within at least one of the neuron circuit blocks.

11. A design structure tangibly embodied in a machine-readable medium for designing, manufacturing, or testing an integrated circuit, the design structure comprising:
    a plurality of synapse blocks electrically connected to a plurality of neuron circuit blocks, the plurality of synapse blocks comprising a plurality of neuromorphic circuits, each neuromorphic circuit comprising:
        a field effect transistor in a diode configuration electrically connected to variable resistance material, the variable resistance material providing a programmable resistance value;
        a first junction electrically connected to the variable resistance material and an output of one or more of the neuron circuit blocks; and
        a second junction electrically connected to the field effect transistor and an input of one or more of the neuron circuit blocks.

12. The design structure of claim 11, wherein the design structure comprises a netlist.

13. The design structure of claim 11, wherein the design structure resides on storage medium as a data format used for the exchange of layout data of integrated circuits.

* * * * *